(12) United States Patent
Jeong et al.

(10) Patent No.: US 7,390,714 B2
(45) Date of Patent: Jun. 24, 2008

(54) METHOD OF MANUFACTURING SEMICONDUCTOR DEVICE HAVING TUNGSTEN GATES ELECTRODE

(75) Inventors: Cheol Mo Jeong, Ichon-si (KR); Whee Won Cho, Cheongju-si (KR); Jung Geun Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 143 days.

(21) Appl. No.: 11/164,804

(22) Filed: Dec. 6, 2005

(65) Prior Publication Data
US 2006/0270152 A1 Nov. 30, 2006

(30) Foreign Application Priority Data
May 25, 2005 (KR) .................. 10-2005-0044219

(51) Int. Cl.
*H01L 21/336* (2006.01)
(52) U.S. Cl. .................................................. 438/257
(58) Field of Classification Search ......... 438/257–267; 257/314–321
See application file for complete search history.

(56) References Cited

U.S. PATENT DOCUMENTS

| | | | |
|---|---|---|---|
| 6,867,128 B2 | 3/2005 | Deleonibus | 438/635 |
| 6,873,019 B2 * | 3/2005 | Ida et al. | 257/382 |
| 6,888,198 B1 * | 5/2005 | Krivokapic | 257/347 |
| 7,052,972 B2 * | 5/2006 | Sandhu et al. | 438/445 |
| 7,074,661 B2 * | 7/2006 | Cho et al. | 438/197 |

FOREIGN PATENT DOCUMENTS

KR 2003-0014499 2/2003

* cited by examiner

*Primary Examiner*—Brook Kebede
*Assistant Examiner*—Phillip S Green
(74) *Attorney, Agent, or Firm*—Marshall, Gerstein & Borun LLP

(57) ABSTRACT

Disclosed herein is a method of manufacturing semiconductor devices. The method includes the steps of forming a gate oxide film, a polysilicon film and a nitride film on a semiconductor substrate, and patterning the gate oxide film, the polysilicon film and the nitride film to form poly gates, forming a spacer at the side of the poly gate, forming a sacrifice nitride film on the entire surface, and then forming an interlayer insulation film on the entire surface, polishing the sacrifice nitride film formed on the interlayer insulation film and the poly gates so that the nitride film is exposed, removing top portions of the sacrifice nitride film while removing the nitride film, forming an insulation film spacer at the side exposed through removal of the nitride film, and filling a portion from which the sacrifice oxide film is removed with an insulation film, and forming the tungsten gates in portions from which the nitride films are moved.

13 Claims, 7 Drawing Sheets

Figure 1A:
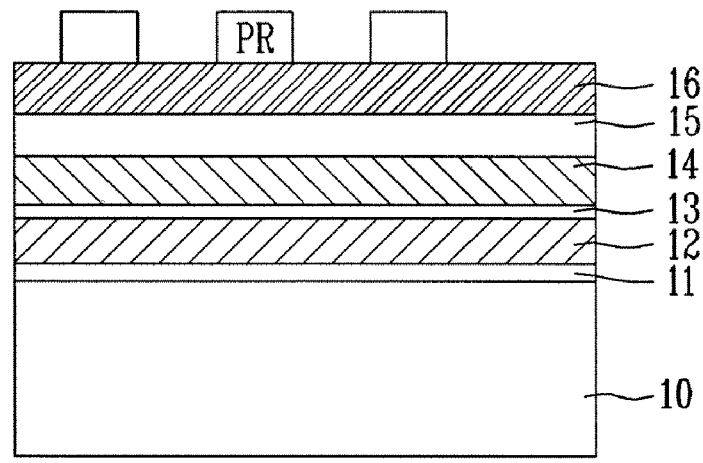

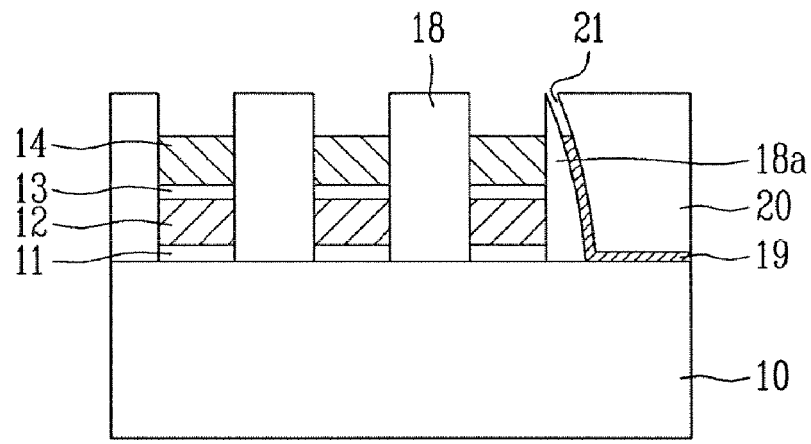
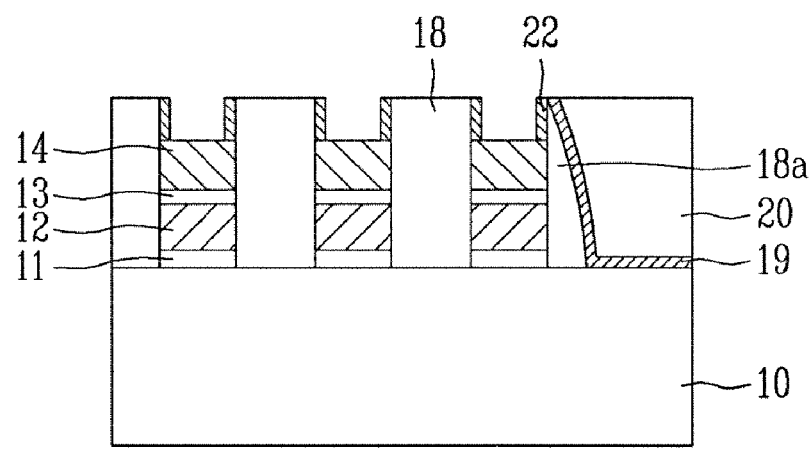
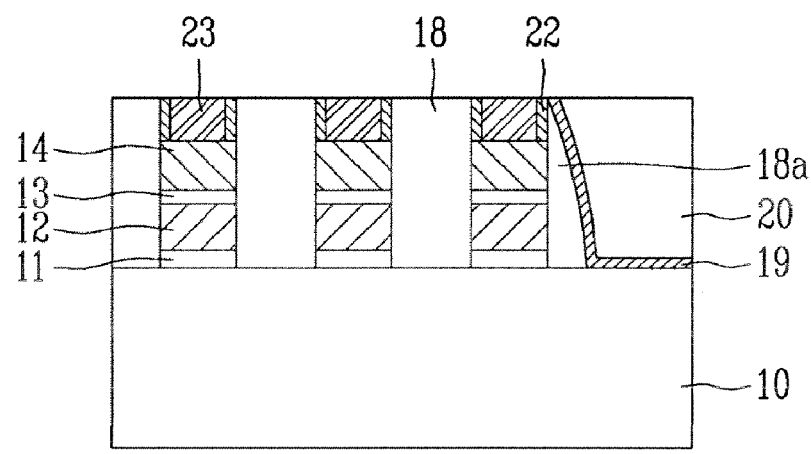

METHOD OF MANUFACTURING SEMICONDUCTOR DEVICE HAVING TUNGSTEN GATES ELECTRODE

BACKGROUND OF THE DISCLOSURE

1. Field of the Disclosure

The present disclosure relates to a method of manufacturing semiconductor devices, and more specifically, to a method of manufacturing semiconductor devices having tungsten gates electrodes.

2. Brief Description of Related Technology

Of semiconductor memory devices, a flash memory device is characterized in that information stored in memory cells is not lost even if power is shut off. Accordingly, the flash memory device has been widely used in memory cards for use in computers, etc.

As a unit cell of the flash memory device, a memory cell having a structure in which a conduction film for floating gate and a conduction film for control gate are sequentially stacked has been widely known.

The conduction film for floating gate and the conduction film for control gate are generally formed using polysilicon. More particularly, a dual structure of a polysilicon film and a tungsten silicide ($WSi_x$) film is generally used as the conduction film for control gate.

As the degree of integration of flash memory devices increases, however, it is difficult to secure resistance in the dual structure of the polysilicon film and the tungsten suicide film. If a thickness is increased in order to secure resistance, there is a problem in that intra-capacitance is increased and inter-gate interference becomes high.

In view of the above, a method has been introduced in which a tungsten nitride (WN) film and a tungsten (W) film serving as barrier films are stacked instead of the tungsten silicide film ($WSi_x$), and the W film, the WN film and a lower layer are etched by means of a Reactive Ion Etching (RIE) method, thus forming a gate.

In the case where the gate is formed by the RIE method, it is difficult to deposit a spacer due to oxidization of tungsten when the spacer is formed in the gate sidewalls after the formation of the gate. There is also a problem in that reliability of the gate is degraded due to the shortage of thermal margin.

Accordingly, the damascene method has been proposed which will replace the RIE method.

In the damascene method, after a tunnel oxide film, a polysilicon film for floating gate and an interlayer dielectric film are formed on a semiconductor substrate, the interlayer dielectric film, the polysilicon film for floating gate and the tunnel oxide film are patterned by photolithography process. An interlayer insulation film is then formed to cover the entire surface. Trenches through which the interlayer dielectric film is exposed are formed in the interlayer insulation film. A polysilicon film for control gate, a barrier film and a W film are deposited within the trenches. The entire surface undergoes Chemical Mechanical Polishing (CMP) so that the interlayer insulation film is exposed, forming a gate.

If misalignment occurs upon etching of the trenches, however, the coupling ratio between the floating gate and the control gate reduces. Accordingly, there are problems in that the speed of the device is lowered and a voltage necessary for device operation increases.

Furthermore, as the degree of integration of memory devices increases and the gate width becomes narrow, the trench width reduces. In this case, the W film has to be deposited after the polysilicon film for control gate and the barrier film are formed within the narrow trenches. This results in a very degraded gap-fill characteristic of the W film.

SUMMARY OF THE DISCLOSURE

Disclosed herein is a method of manufacturing semiconductor devices having tungsten gates electrodes, wherein gate resistance and inter-gate interference can be reduced. The method results in improved operation speed and a lower voltage necessary for operation of the device, by enhancing the coupling ratio between the floating gate and the control gate. Exposure of tungsten to high temperature can be avoided by the disclosed method and, thus, the disclosed method can prevent degradation of reliability of a device due to tungsten oxidization. The disclosed method results in an improved gap-fill characteristic of a tungsten (W) film.

According to one embodiment, the method includes the steps of (a) forming a gate oxide film, a polysilicon film and a nitride film on a semiconductor substrate, and patterning the gate oxide film, the polysilicon film and the nitride film to form poly gates, (b) forming a spacer at the side of the poly gate, (c) forming a sacrifice nitride film on the entire surface, and then forming an interlayer insulation film on the entire surface, (d) polishing the sacrifice nitride film formed on the interlayer insulation film and the poly gates so that the nitride film is exposed, (e) removing top portions of the sacrifice nitride film while removing the nitride film, (f) forming an insulation film spacer at the side exposed through removal of the nitride film, and filling a portion from which the sacrifice oxide film is removed with an insulation film, and (g) forming the tungsten gates in portions from which the nitride films are moved.

Preferably, the step of forming the poly gates can include the steps of forming a hard mask on the nitride film, patterning the hard mask, etching the nitride film, the polysilicon film and the gate oxide film using the patterned hard mask as a mask, and removing the hard mask film.

Preferably, the hard mask film can be an alpha carbon film.

Preferably, the hard mask film can be formed to a thickness of 500 to 2000 Å.

Preferably, the hard mask film can be removed using oxygen plasma.

Preferably, the nitride film can be formed to a thickness of 500 to 2000 Å.

Preferably, the step (d) can include the steps of polishing the interlayer insulation film by CMP so that the sacrifice nitride film is exposed, and performing an additional CMP process such that the sacrifice nitride film formed on the poly gates is completely removed.

Preferably, at the time of the additional CMP process, the nitride film below the sacrifice nitride film can be removed up to a thickness of 200 to 500 Å.

Preferably, in the step (e), the nitride film and the sacrifice nitride film can be removed using a phosphoric acid solution.

Preferably, the step (f) can include the steps of depositing an insulation film on the entire surface, thus filling a portion from which the sacrifice oxide film is removed with the insulation film, and etching back the insulation film to form the insulation film spacer at the side exposed through removal of the nitride film.

Preferably, the insulation film can be formed to a thickness of 50 to 300 Å.

Preferably, the insulation film can be formed using a nitride film or an oxide film.

Preferably, the method can further include the step of removing the interlayer insulation film and the sacrifice nitride film of the contact region to form a contact hole, before the step (g) is performed after the step (f), wherein when the tungsten gates are formed in the step (g), the contact hole is buried with tungsten to form a contact.

Additional features of the disclosed method may become apparent to those skilled in the art from a review of the following detailed description, taken in conjunction with the drawing figures and the appended claims.

BRIEF DESCRIPTION OF THE DRAWING FIGURES

For a more complete understanding of the disclosed method, reference should be made to the following detailed description and accompanying drawing wherein:

FIGS. 1a to 1i are sectional views for explaining a first embodiment of a method of manufacturing semiconductor devices; and FIGS. 2a to 2j are sectional views for explaining a second embodiment of the method of manufacturing semiconductor devices.

While the disclosed method is susceptible of embodiments in various forms, there are illustrated in the drawing (and will hereafter be described) specific embodiments of the disclosed method, with the understanding that the disclosure is intended to be illustrative, and is not intended to limit the claimed invention to the specific embodiments described and illustrated herein.

DETAILED DESCRIPTION OF THE PREFERRED EMBODIMENTS

Now, the preferred embodiments according to the disclosed method will be described with reference to the accompanying drawings. Since preferred embodiments are provided for the purpose that the ordinary skilled in the art are able to understand the disclosed method, they may be modified in various manners and the scope of the claimed invention is not limited by the preferred embodiments described later.

FIGS. 1a to 1i are sectional views for explaining a method of manufacturing semiconductor devices according to a first embodiment.

Referring to FIG. 1a, a tunnel oxide film 11, a first polysilicon film 12 for floating gate, an interlayer dielectric film 13, a second polysilicon film 14 for control gate and a nitride film 15 are sequentially formed on a semiconductor substrate 10. A hard mask film 16 is formed on the nitride film 15.

The nitride film 15 can be formed to a thickness of 500 to 2000 Å, and the hard mask film 16 can be formed to a thickness of 500 to 2000 Å. The hard mask film 16 can be formed using an alpha carbon film.

The hard mask film 16 formed using the alpha carbon film is a material having an etch selectivity of about 4 to 10 to the tunnel oxide film 11, the first polysilicon film 12, the interlayer dielectric film 13, the second polysilicon film 14 and the nitride film 15. It serves to uniformly maintain a thickness of the nitride film 15 in a subsequent gate etch process.

Thereafter, a photoresist PR is coated on the hard mask film 16 and is then patterned by an exposure and development process.

Figure 1B:
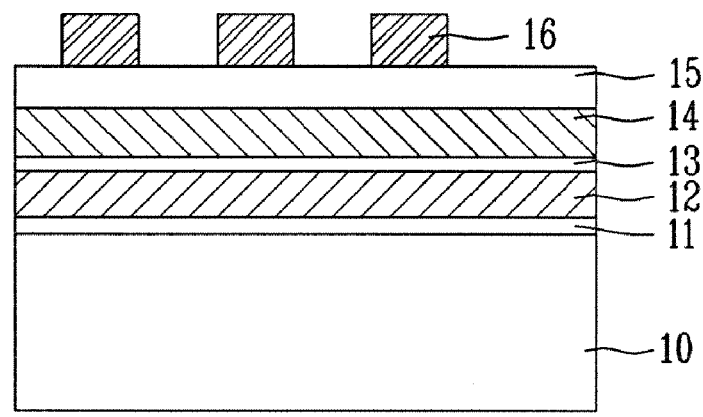

Referring to FIG. 1b, after the hard mask film 16 is patterned by an etch process using the patterned photoresist PR as an etch mask, the photoresist PR is removed.

Figure 1C:
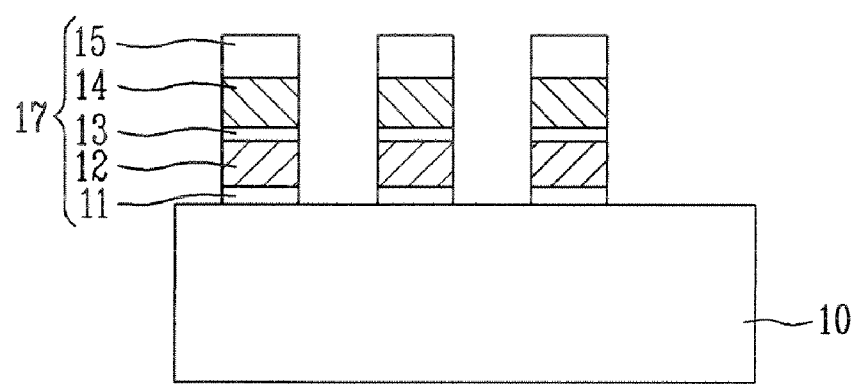

Referring next to FIG. 1c, the nitride film 15, the second polysilicon film 14, the interlayer dielectric film 13, the first polysilicon film 12 and the tunnel oxide film 11 are etched using the patterned hard mask film 16 as a mask, forming a poly gate 17. The hard mask film 16 has an etch selectivity of about 4 to 10 to a lower etched layer. It is thus possible to sufficiently secure etch margin in an etch process of the poly gate.

In the etch process of the poly gate, the hard mask film 16 is also etched. Some of the hard mask film 16 remains on the nitride film 15.

The remaining hard mask film 16 is removed using oxygen ($O_2$) plasma.

Source and drain impurity ions are then injected into the entire surface to form a source and drain junction (not shown) within the semiconductor substrate 10 at both sides of the poly gate 17.

Figure 1D:
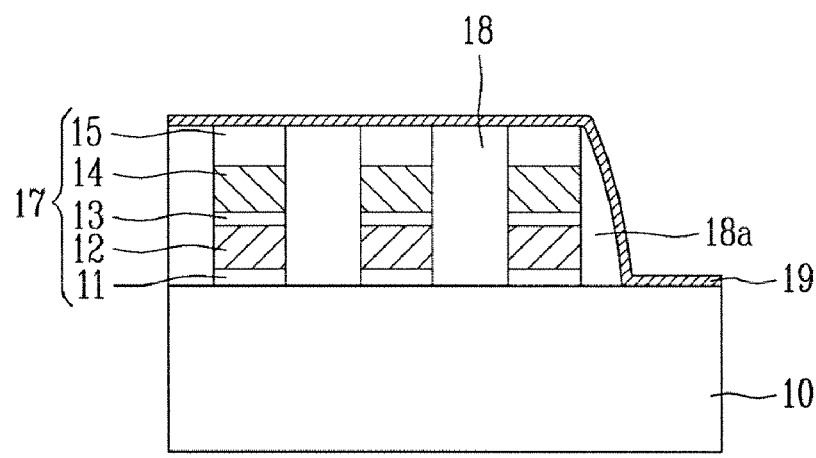

Referring to FIG. 1d, an oxide film 18 is deposited on the entire surface and is then etched back to form a spacer 18a on the side of the poly gate 17 in a contact formation region.

During the etch-back process, the oxide film 18 remains intact at portions where a distance between the poly gates 17 is narrow, whereas the oxide film 18 is etched in a contact region where a distance between the poly gates 17 is wide, so that the spacer 18a is formed in the contact region.

Figure 1E:
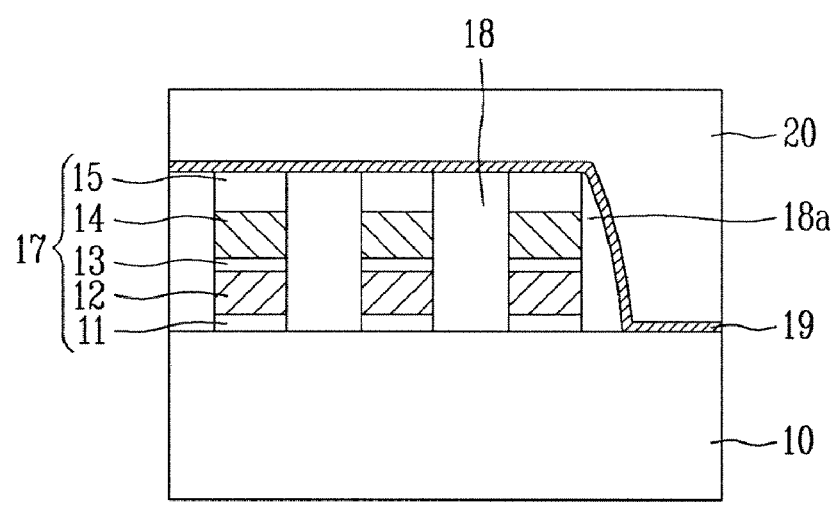

Thereafter, a sacrifice nitride film 19 is deposited on the entire surface of the semiconductor substrate 10. As shown in FIG. 1e, a High Density Plasma (HDP) oxide film is deposited on the entire surface to form an interlayer insulation film 20.

Figure 1F:
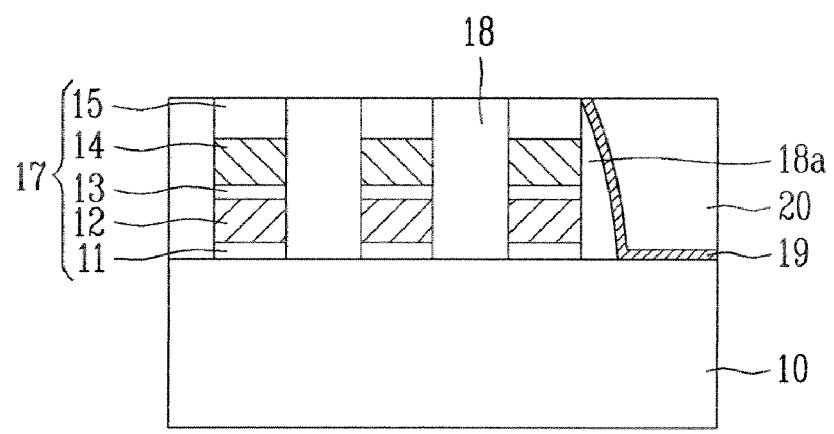

Referring to FIG. 1f, the interlayer insulation film 20 undergoes CMP using Low Selective Slurry (LSS) and High Selective Slurry (HSS) so that the sacrifice nitride film 19 is exposed. Over CMP is then performed to remove the sacrifice nitride film 19 formed on the poly gate 17.

Upon over CMP, the nitride film 15 below the sacrifice nitride film 19 is removed up to 200 to 500 Å so that the sacrifice nitride film 19 on the poly gate 17 can be completely removed.

Thereafter, as shown in FIG. 1g, the nitride film 15 is removed by dipping out it into a phosphoric acid ($H_3PO_4$) solution, thus exposing the top and lateral portions of the oxide film 18. At this time, the top of the sacrifice nitride film 19 is partially removed to form a groove 21.

Referring next to FIG. 1h, a nitride film or an oxide film is formed to a thickness of 50 to 300 Å on the entire surface, forming an insulation film. The insulation film is blanket-etched to form insulation film sidewalls 22 on the sides of the exposed oxide film 18. The groove 21 is filled with the insulation film.

Referring to FIG. 1i, a barrier film and a tungsten (W) film are sequentially deposited on the entire surface. The entire surface undergoes CMP so that the oxide film 18 and the interlayer insulation film 20 are exposed, thereby forming tungsten gates 23.

Upon deposition of the W film, one of Chemical Vapor Deposition (CVD), Pulsed Nucleation Layer (PNL) and Atomic Layer Deposition (AND) methods can be used. The barrier film can be formed using one of a WN film, a Ti/TiN film and a Ta/TaN film.

Thereby, a control gate consisting of the second polysilicon film 14 and the tungsten gates 23 is completed.

Though not shown in the drawing, an upper interlayer insulation film is formed on the entire surface. The upper interlayer insulation film, the interlayer insulation film 20 and the sacrifice nitride film 19 are selectively removed by a photolithography process so that the semiconductor substrate 10 of the contact region is exposed, thus forming a contact hole. A conductive film is buried into the contact hole to form a source contact.

As such, the semiconductor device according to a first embodiment of the disclosed method is completed.

FIGS. 2a to 2j are sectional views for explaining a method of manufacturing semiconductor devices according to a second embodiment.

The second embodiment and the first embodiment are different from each other in that in the first embodiment, the tungsten gates are formed and the source contact is then formed, whereas in the second embodiment, the tungsten gates and the source contact are formed at the same time.

The process until the insulation film sidewalls 22 is formed (see FIGS. 2a to 2h) is the same as that shown in FIGS. 1a to 1h of the first embodiment. Description thereof will be omitted in order to avoid redundancy.

Figure 2A:
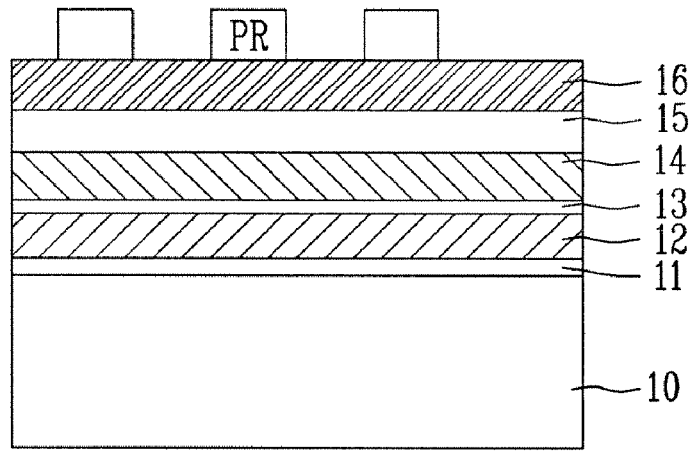
Figure 2B:
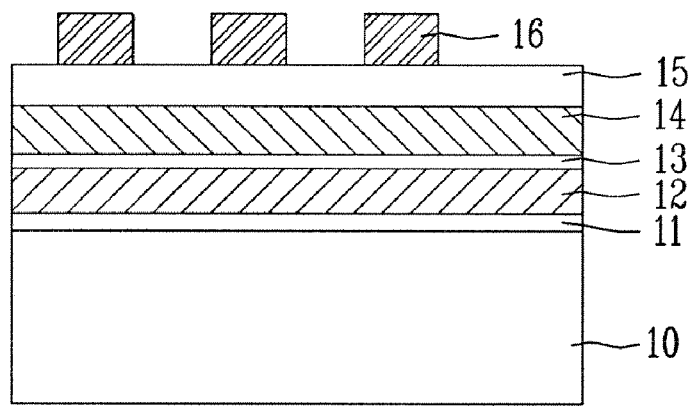
Figure 2C:
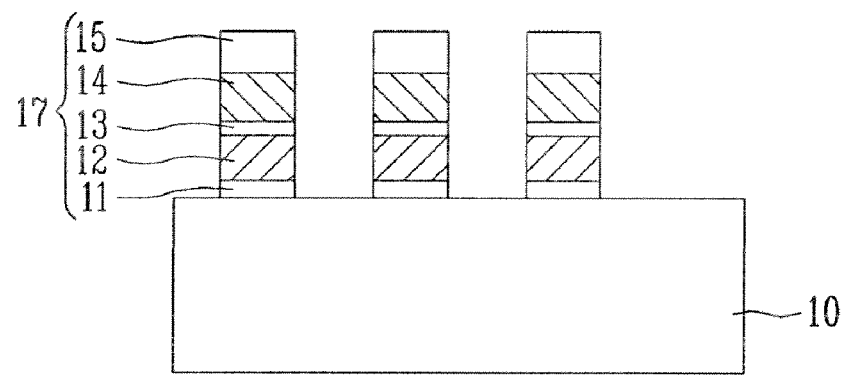
Figure 2D:
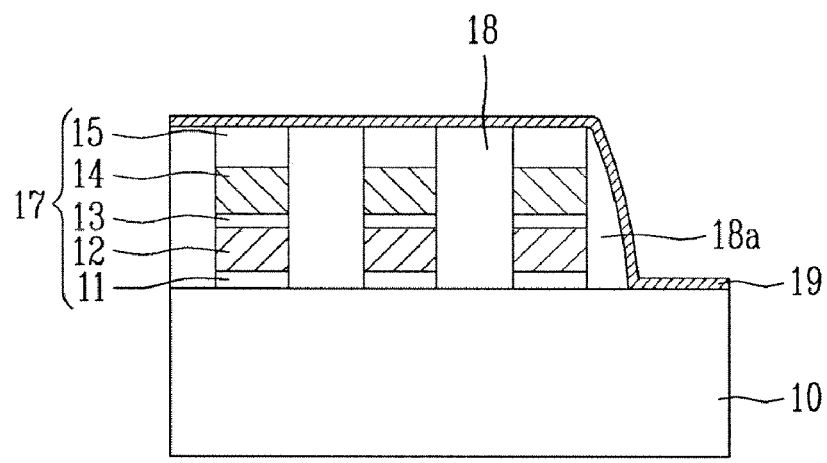
Figure 2E:
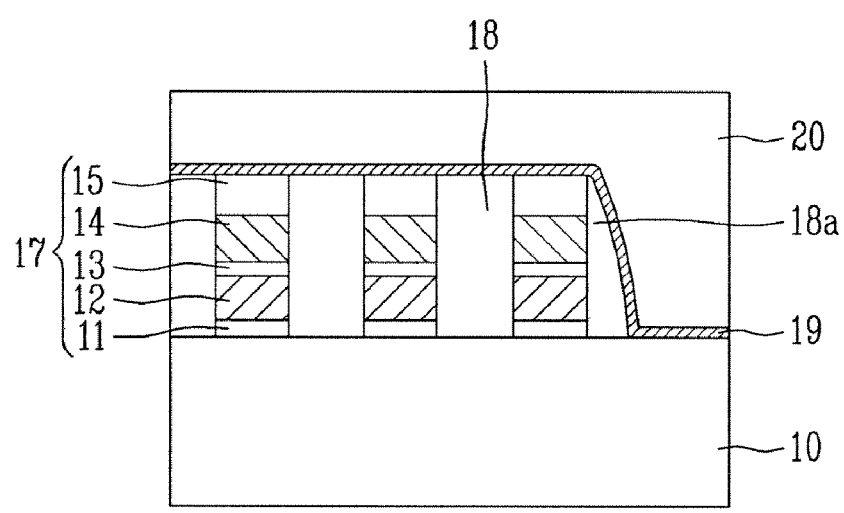
Figure 2F:
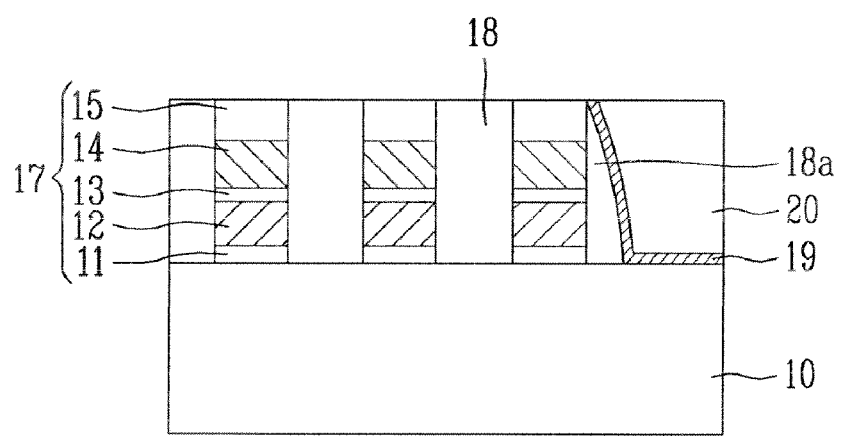
Figure 2G:
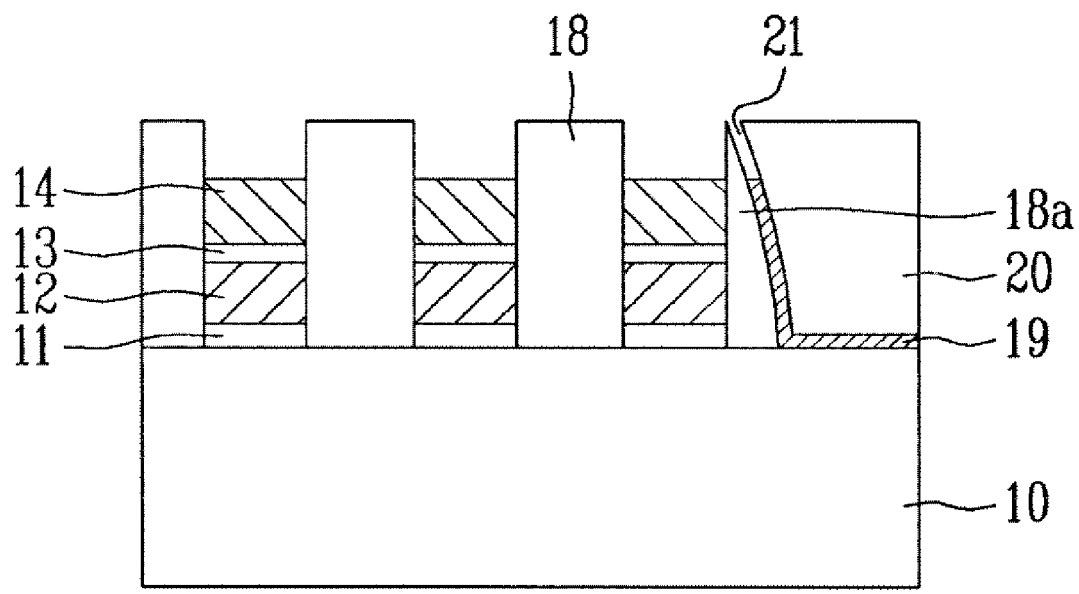
Figure 2H:
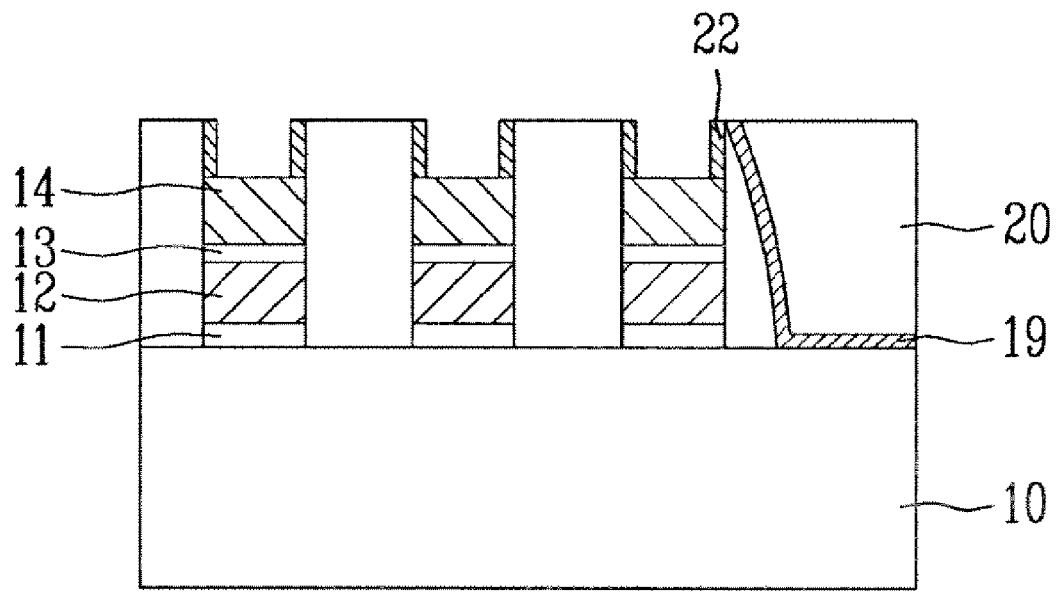
Figure 2I:
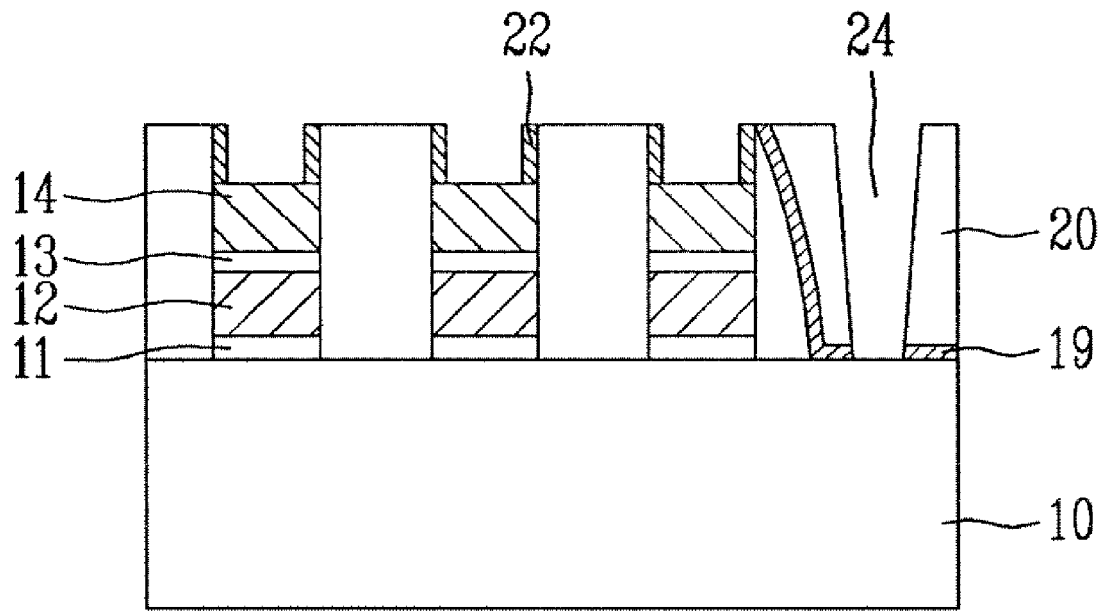

After the processes shown in FIGS. 2a to 2h are completed, as shown in FIG. 2i, the interlayer insulation film 20 and the sacrifice nitride film 19 of the contact region are selectively etched by a photolithography process, thus forming a source contact hole 24.

Figure 2J:
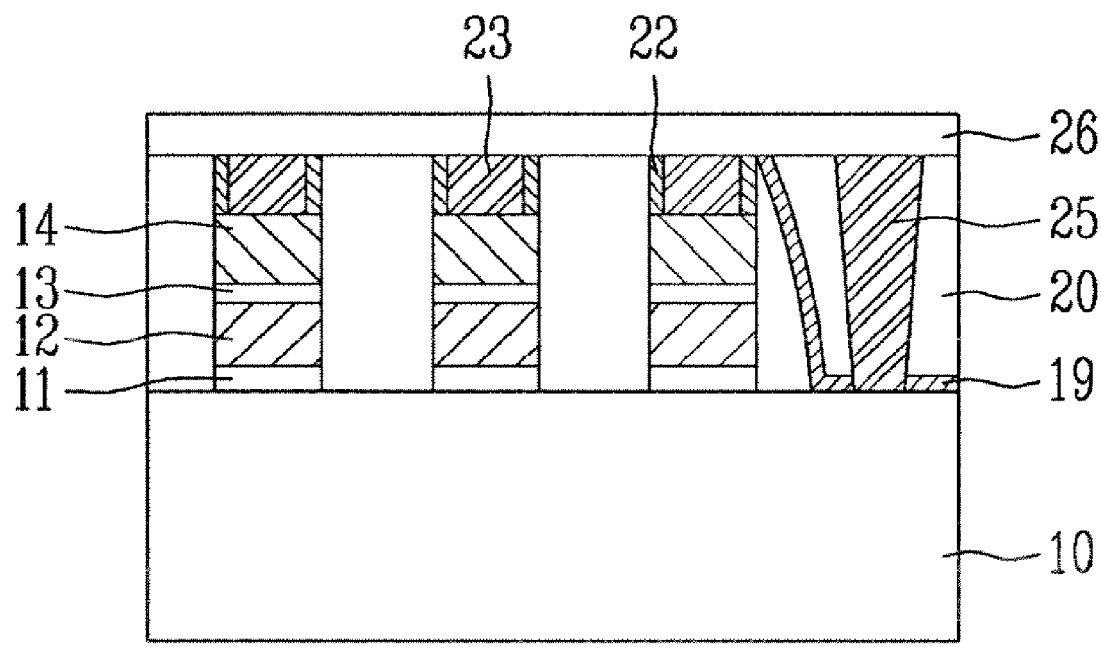

Referring next to FIG. 2j, a barrier film and a W film are deposited on the entire surface. The entire surface undergoes CMP such that the oxide film 18 and the interlayer insulation film 20 are exposed. As such, tungsten gates 23 are formed on the second polysilicon films 14 and a source contact 25 is formed within the source contact hole 24.

Upon deposition of the W film, one of the CVD, PNL and ALD methods can be used. The barrier film can be formed using one of the WN film, the Ti/TiN film and the Ta/TaN film.

Next, in order to perform a subsequent process, an upper interlayer insulation film 26 is formed.

Thereby, fabrication of the semiconductor device according to a second embodiment of the present invention is completed.

As such, the second embodiment has an effect in that the number of process steps can be reduced since the tungsten gates and the source contact are formed at the same time unlike the first embodiment.

Furthermore, upon CMP of the W film, the source contact is located in the contact region where a distance between the gate patterns is wide. Therefore, the W film is uniformly distributed over the entire substrate. Accordingly, global flatness can be accomplished in the CMP process of the W film.

In the aforementioned embodiments, a method of fabricating flash memory devices has been described. It is, however, to be understood that the disclosed method is not restricted to fabrication of flash memory devices, but can be applied to all semiconductor devices having tungsten gates.

The disclosed method has the following advantageous effects.

The alpha carbon film is used as the hard mask and a thickness of the nitride film is uniform. It is thus possible to improve thickness uniformity of the tungsten gates formed at portions from which the nitride film is removed.

Furthermore, since the tungsten gates can be formed to a uniform thickness, the uniformity of gate resistance can be improved.

Still further, an overlap area between the floating gate and the control gate can be increased. Therefore, the coupling ratio can be improved and the speed of a device can be enhanced.

Additionally, the spacer is formed before the tungsten gates are formed. Accordingly, it is possible to prevent exposure of the tungsten gates to a high temperature and to prevent degradation of reliability of a device due to tungsten oxidization.

Furthermore, gate resistance can be reduced because tungsten having low resistance compared to existing tungsten silicide is used.

Still further, it is not necessary to increase the height of the gate so as to lower gate resistance. Inter-gate interference can be reduced accordingly.

Additionally, since the tungsten gates and the source contact are formed at the same time, the number of process steps can be reduced.

Furthermore, upon CMP of the W film, the source contact is located in the contact region where a distance between gate patterns is wide. Therefore, the W film can be uniformly distributed over the entire substrate. Accordingly, global flatness can be accomplished in the CMP process of the W film.

What is claimed as new and desired to be protected by Letters Patent of the United States is:

1. A method of manufacturing a semiconductor device having tungsten gate electrodes, comprising;
    (a) forming a gate oxide film on a semiconductor substrate, a polysilicon film above the gate oxide film, and a nitride film above the polysilicon film, and then patterning the nitride film, the polysilicon film, and the gate oxide film to form a plurality of poly gates;
    (b) forming a spacer at a side of at least one of the poly gates;
    (c) forming a sacrificial nitride film on the entire resulting surface including the poly gates and the spacer, and then forming an interlayer insulation film on the entire resulting surface including the sacrificial nitride film;
    (d) removing a portion of the interlayer insulation film to expose a portion of the sacrificial nitride film formed on the poly gates, and then polishing the sacrificial nitride film formed on the poly gates to expose the nitride film;
    (e) removing a top portion of the sacrificial nitride film while removing the nitride film;
    (f) forming an insulation film spacer at the side exposed through removal of the nitride film, and filling a portion from which the sacrificial nitride film is removed with an insulation film; and
    (g) forming tungsten gates in portions from which the nitride films are removed.

2. The method of claim 1, wherein (a) further comprises:
forming a hard mask film on the nitride film;
patterning the hard mask film;
etching the nitride film, the polysilicon film, and the gate oxide film using the patterned hard mask film as a mask, thereby forming the plurality of poly gates; and
removing the hard mask film.

3. The method of claim 2, wherein the hard mask film is an alpha carbon film.

4. The method of claim 2, comprising forming the hard mask film to a thickness of 500 Å to 2000 Å.

5. The method of claim 2, comprising removing the hard mask film using oxygen plasma.

6. The method of claim 1, comprising forming the nitride film to a thickness of 500 Å to 2000 Å.

7. The method of claim 1, wherein (d) comprises the steps of:
polishing the interlayer insulation film by chemical mechanical polishing to expose the sacrificial nitride film; and
performing an additional chemical mechanical polishing process to completely remove the sacrificial nitride film formed on the poly gates.

8. The method of claim 7, wherein the additional chemical mechanical polishing process comprises removing the nitride film below the sacrificial nitride film up to a thickness of 200 Å to 500 Å.

9. The method of claim 1, wherein (e) further comprises removing the nitride film and the sacrificial nitride film with a phosphoric acid solution.

10. The method of claim 1, wherein (f) further comprises:
depositing an insulation film on the entire surface to fill a portion from which the sacrificial nitride film is removed with the insulation film; and
etching back the insulation film to form the insulation film spacer at the side exposed through removal of the nitride film.

11. The method of claim 10, comprising forming the insulation film to a thickness of 50 Å to 300 Å.

12. The method of claim 10, wherein the insulation film is selected from the group consisting of nitride films and oxide films.

13. The method of claim 1, wherein (g) further comprises removing the interlayer insulation film and the sacrificial nitride film of the contact region to form a contact hole and then forming the tungsten gates in portions from which the nitride films have been removed, wherein the contact hole is buried with tungsten to form a contact.

* * * * *